US010439362B2

(12) United States Patent
Stanczyk et al.

(10) Patent No.: US 10,439,362 B2
(45) Date of Patent: Oct. 8, 2019

(54) ALINGAN ALLOY BASED LASER DIODE (71) Applicants: TOPGAN sp. z o.o., Warsaw (PL); INSTYTUT WYSOKICH CISNIEN POLSKIEJ AKADEMII NAUK, Warsaw (PL)

(72) Inventors: Szymon Stanczyk, Gdynia (PL); Anna Kafar, Gdynia (PL); Tadeusz Suski, Nowy Prazmow (PL); Szymon Grzanka, Pruszkow (PL); Robert Czernecki, Kalina (PL); Piotr Perlin, Warsaw (PL)

(73) Assignees: TOPGAN SP. Z O.O., Warsaw (PL); INST. WYSOKICH CISNIEN POLSKIEJ AKADEMII NAUK, Warsaw (PL)

( * ) Notice: Subject to any disclaimer, the term of this patent is extended or adjusted under 35 U.S.C. 154(b) by 0 days.

(21) Appl. No.: 15/774,695

(22) PCT Filed: Nov. 10, 2016

(86) PCT No.: PCT/PL2016/050053
§ 371 (c)(1),
(2) Date: May 9, 2018

(87) PCT Pub. No.: WO2017/082746
PCT Pub. Date: May 18, 2017

(65) Prior Publication Data
US 2018/0331501 A1    Nov. 15, 2018

(30) Foreign Application Priority Data
Nov. 10, 2015 (PL) .................................. P.414739

(51) Int. Cl.
H01S 5/00    (2006.01)
H01S 5/32    (2006.01)
(Continued)

(52) U.S. Cl.
CPC .......... *H01S 5/3211* (2013.01); *H01S 5/2009* (2013.01); *H01S 5/2031* (2013.01);
(Continued)

(58) Field of Classification Search
CPC ........ H01S 5/2031; H01S 5/2009; H01S 5/22; H01S 5/305; H01S 5/3063;
(Continued)

(56) References Cited

U.S. PATENT DOCUMENTS 4,916,708 A    4/1990 Hayakawa
5,173,912 A    12/1992 Iwase et al.
(Continued)

OTHER PUBLICATIONS

L.A. Coldren, S.W. Corzine, "Diode Lasers and Photonic Integrated Circuits" (Wiley Series in Microwave and Optical Engineering), chapters 1-3.
(Continued)

Primary Examiner — Kinam Park
(74) Attorney, Agent, or Firm — Cherskov Flaynik & Gurda, LLC (57) ABSTRACT The invention relates to an AlInGaN alloy based laser diode, which uses a gallium nitride substrate. It also includes a lower cladding layer, a lower light-guiding layer-cladding, a light emitting layer, an upper light-guiding-cladding layer, an upper cladding layer, and a subcontact layer. The lower light-guiding-cladding layer and the upper light-guiding-cladding layer have a continuous, non-step-like and smooth change of indium and/or aluminum content.

11 Claims, 4 Drawing Sheets (51) Int. Cl.
*H01S 5/323* (2006.01)
*H01S 5/30* (2006.01)
*H01S 5/34* (2006.01)
*H01S 5/20* (2006.01)
*H01S 5/22* (2006.01)
*H01S 5/343* (2006.01)

(52) U.S. Cl.
CPC ............... *H01S 5/22* (2013.01); *H01S 5/305* (2013.01); *H01S 5/3013* (2013.01); *H01S 5/3063* (2013.01); *H01S 5/32341* (2013.01); *H01S 5/3409* (2013.01); *H01S 5/34333* (2013.01)

(58) Field of Classification Search
CPC ............... H01S 5/34333; H01S 5/3409; H01S 5/32341; H01S 5/3013; H01S 5/3211
See application file for complete search history.

(56) References Cited

U.S. PATENT DOCUMENTS

| | | | |
|---|---|---|---|
| 6,555,403 B1* | 4/2003 | Domen | B82Y 20/00 438/22 |
| 9,042,416 B1 | 3/2015 | Ho et al. | |
| 2004/0051107 A1* | 3/2004 | Nagahama | B82Y 20/00 257/79 |
| 2004/0056259 A1* | 3/2004 | Goto | B82Y 20/00 257/79 |
| 2005/0104080 A1* | 5/2005 | Ichihara | H01L 33/32 257/98 |
| 2010/0008391 A1* | 1/2010 | Nakagawa | B82Y 20/00 372/45.011 |

OTHER PUBLICATIONS

Nakamura, S. (1999), "InGaN/GaN/AlGaN-based laser diodes grown on epitaxially laterally overgrown GaN," Journal of Materials Research, 14(7), 2716-2731. doi:10.1557/JMR.1999.0365.

* cited by examiner

Fig. 5b

ALINGAN ALLOY BASED LASER DIODE

PRIORITY CLAIM

The instant application claims priority as a U.S. Nationalization of PCT case PCT/PL2016/050053, with an international filing date of Nov. 10, 2016, which in turn claimed priority to a Polish application P.414739 filed on Nov. 10, 2015, the contents of each of which are incorporated herein by reference.

BACKGROUND OF THE INVENTION

Technical Field

The invention relates to a laser diode produced on the basis of AlInGaN alloy with a spatially varying indium and/or aluminum content in the guiding layer, characterized by improved opto-electric parameters, specifically a lower current threshold, having application in optoelectronics, photonics and optical fiber systems, particularly as a source of visible light.

Background

Laser diodes are usually manufactured as devices with separate confinement of current and light carriers. Such structure Is referred to as Separate Confinement Heterostructure. On a monocrystalline substrate, e.g. of GaAs, InP or GaN, a sequence of thin semiconductor layers is created, described, among others, in the publication by L. A. Coldren, S. W. Corzine, "Diode Lasers and Photonic Integrated Circuits" (Wiley Series in Microwave and Optical Engineering). The active layer of such devices are quantum wells confined within quantum barriers, and the light is guided In a light-guide made of layers with high refractive index surrounding the active part of the laser, confined by layers with low refractive index. Further on in the present description, the term "diode light-guide" shall relate to a section of the quantum wells area and light-guiding layers surrounding them, where the light is guided in the device. Lateral confinement for the carriers and light can be obtained in any way (e.g. by means of the structures: index guiding, gain guiding, mesa, buried ridge) without any influence on the generality of the reasoning below. The lateral confinement results in obtaining a high density of light and carriers in the active area.

In case of group III metal nitride based laser diodes, emitting light within the range of 390-550 nm, the layers mentioned above are executed in a characteristic way described, among others, in publication by S. Nakamura, "InGaN/GaN/AlGaN-based laser diodes grown on epitaxiaiiy laterally overgrown GaN," J. Mater. Res. 14, 2716 (1999) and in U.S. Pat. No. 6,838,693 B2. Crystalline gallium nitride with thickness of 50 to 200 µm is used as the substrate. Mechano-chemical polishing is used to prepare the surface of the gallium nitride in order to obtain an atomically smooth surface for the epitaxial growth. The atomic steps are obtained by polishing the surface at a chosen angle in relation to the crystallographic planes of the crystal. Their density affects the amount of indium incorporated in the InGaN layers in the epitaxial growth later on (the mechanism described, among others, in the publication Sarzynski et al., "Lateral Control of Indium Content and Wavelength of III-Nitride Diode Lasers by Means of GaN Substrate Patterning," Appl. Phys. Express 5, 021001 (2012)).

The device can be grown by the metal-organic chemical vapour deposition as well as by the method of molecular beam epitaxy. The cladding layers are made of gallium-aluminium nitride $Ai_xGa_{1-x}N$, wherein x Is within the range of 0 to 0.12, with the layer thickness of 0.5 µm to 5 µm. The lower cladding layer is usually silicon doped at the level of $5\times10^{18}$ cm$^{-3}$. The upper cladding layer Is usually magnesium doped at the level of $5\times10^{18}$ cm$^{3}$ to $1\times10^{20}$ cm$^{-3}$. The light-guiding layers are usually made of $In_xGa_{1-x}N$, for which the x is within range of 0 to 0.1, with thickness of 0.05 µm to 0.3 µm. The lower light-guiding layer can be silicon doped, while the upper light-guiding layer can be magnesium doped. Both light-guiding layers can also be undoped. For diodes with emission within range of 390-550 nm, the electron blocking layers are made of $Al_xGa_{1-x}N$, wherein x is in the range of Q to 0.3. The quantum well forming layer is made of $In_xGa_{1-x}N$, wherein x is in the range of 0 io 0.4, with layer thickness of 1 nm to 10 nm.

Light guiding, in the direction parallel to the optical axis and perpendicular to the junction surface, is obtained by etching the selected regions of the epitaxial structure to the depth that is not greater than the interface between the upper cladding and the upper light guide layer. The etch contour is selected in such a way that the remaining region forms a rectangular light guide, perpendicular to the crystal cleavage planes. From the top side of the device, electric power is supplied exclusively through the upper surface of the ridge.

The fundamental parameters, based on which the quality of a laser diode is evaluated, are the increase of gain with current, optical losses, threshold current and voltage, increase of optical power with current above the threshold current and the shape of the near and far field of the emitted light.

The patent application US20040051107A1 discloses a nitride semiconductor device including an active layer disposed between a semiconductor layer with n-type electrical conductivity and a semiconductor layer with p-type electrical conductivity. The active layer is constituted by quantum wells with general formula AlInGaN, displaying the highest emission efficiency for short electromagnetic waves, about 380 nm. The active layer coincides with the light guiding layers, i.e. wave guiding layers, on both sides of the device. In one embodiment of the cited laser device, the doping profile of the light guiding layers is changing nonlinearly and continuously, due to which a gradient of changes in composition of the individual layer has been obtained, so called GRIN (Gradient Refractive Index) structure. That, in turn, entails an improvement in carrier injection into the active layer, simultaneously improving the optoelectric parameters of the semiconductor laser itself. In the presented solution, in spite of applying a gradient change in doping, the profile of the refractive index change still displays a step-like structure, which causes an occurrence of unfavourable interfaces on medium boundaries, worsening the optoelectric properties of the designed semiconductor device. That is due to the fact that doping of the semiconductor layers has very little effect on the change of their refractive index.

From the U.S. Pat. No. 5,173,912A, a semiconductor laser diode is known, including a first active layer and a second active layer, wherein at least one of the active layers constitutes a quantum well structure, single or multiple. In one of the embodiments of the cited diode, on both sides of the active layer, light guiding layers are present, having a GRIN-SCH (Gradient Refractive INdex—Separate Confinement Heterostructure) type structure, in which a composition change occurs, resulting in a gradient distribution of the refractive index. Applying this type of structure has caused a decrease of emission loses of the laser diode and resulted in a lower density of the threshold current. In the presented solution, a step-like change of the refractive index was obtained due to the growth of multiple thin films with constant alloy composition during the growth of the given layer, wherein the composition of consecutive layers was changing. This results in occurrence of many interfaces between these thin films, negatively affecting the optoelectric properties of the nitride semiconductor device.

The U.S. Pat. No. 9,042,416B1, in turn, discloses a GRINSCH type laser with high power and low losses, consisting of a multilayer of p-type doped semiconductor, and active layer in form of quantum wells, and a multilayer of n-type doped semiconductor. The characteristic feature of the cited semiconductor laser is a configuration asymmetry, in which the optical boundary is shifted towards the n-type conduction multilayer. This was obtained, among others, by means of a gradient distribution of the refractive index on the side of the n-type conduction multilayer. In the presented solution a step-gradient change of the refractive index was applied on the n-type semiconductor side. This manipulation allowed reducing the light guide losses significantly and in effect increasing the semiconductor laser efficiency. However it resulted in occurrence of optical interfaces at the contact of individual layers, which negatively affects the optical properties of the produced semiconductor laser.

BRIEF DESCRIPTION OF THE DRAWINGS

The invention together with the above and other objects and advantages will be best understood from the following detailed description of the preferred embodiment of the invention shown in the accompanying drawings, wherein.

DETAILED DESCRIPTION

The technical problem faced by the present invention is proposing such a construction of an AlInGaN alloy based laser diode, which would be characterised by improved opto-electric parameters, particularly a low threshold current and the highest possible increase of power as a function of current, above the threshold current of the laser diode. Simultaneously, there is a desire for a problem solution that would not involve any significant change in the present manufacturing process, thereby not causing a significant increase of the cost of a single device. Unexpectedly, the mentioned technical difficulties were solved by the presented invention.

The present invention relates to AlInGaN alloy based laser diode, comprising a gallium nitride substrate, a lower cladding layer with n-type electrical conductivity, a lower light-guiding-cladding layer with n-type electrical conductivity, a light emitting layer, an upper light-guiding-cladding layer with p-type electrical conductivity, an upper cladding layer with p-type electrical conductivity, and a subcontact layer with p-type electrical conductivity, characterised in that the lower light-guiding-cladding layer and upper light-guiding-cladding layer have a continuous, non-step-like and smooth change of indium and/or aluminium content. In a preferred embodiment of the invention the lower light-guiding-cladding layer has a continuous, non-step-like and smooth change of the refractive index $n_n$, described by the equation (W1):

$$n_n = \frac{a_1 - a_4}{1 + e^{\frac{-(x-a_3)}{a_2}}} + a_4, \tag{W1}$$

where: x is the distance from the light emitting layer; $a_1$ is in range of 2.38 to 2.66; $a_2$ is in range of 1 to 100; $a_3$ is in range of −800 to 0; $a_4$ is in range of 2.32 to 2.57.

In another preferred embodiment of the invention, the lower light-guiding-cladding layer has a continuous, non-step-like and smooth change of the silicon doping profile $dop_n$, described by the equation (W3):

$$dop_n = \frac{-c_1}{1 + e^{\frac{-(x-c_3)}{c_2}}} + c_1, \tag{W3}$$

where: x is the distance from the light emitting layer; $c_1$ is in range of $1 \times 10^{18}$ to $1 \times 10^{20}$, $c_2$ is in range of 1 to 100; $c_3$ is in range of −800 to 0.

In the next preferred embodiment of the invention the upper light-guiding-cladding layer has a continuous, non-step-like and smooth change of the refractive index $n_p$, described by the equation (W2):

$$n_p = \frac{b_4 - b_1}{1 + e^{\frac{-(x-b_3)}{b_2}}} + b_1, \tag{W2}$$

where: x is the distance from the light emitting layer; $b_1$ is in range of 2.32 to 2.57; $b_2$ is in range of 1 to 100; $b_3$ is in range of 0 to 800; $b_4$ is in range of 2.38 to 2.66.

Preferably, the upper light-guiding-cladding layer has a continuous, non-step-like and smooth change of the silicon doping profile $dop_p$, described by the equation (W4):

$$dop_p = \frac{d_1}{1 + e^{\frac{-(x-d_3)}{d_2}}}, \tag{W4}$$

where: x is the distance from the light emitting layer; $d_1$ is in range of $1 \times 10^{18}$ to $1 \times 10^{20}$, $d_2$ is in range of 1 to 100; $d_3$ is in range of 0 to 800.

In the presented equations (W1), (W2), (W3) and (W4), coefficients: $a_1$ and $b_1$ specify the parameter defining the maximal refractive index, $a_2$ and $b_2$ specify the parameter defining the spatial change of the refractive index between the region with the lowest and the highest refractive index, $a_3$ and $b_3$ specify the parameter defining the location of the point of the inflection of the light-guiding-cladding layer refractive index profile, $a_4$ and $b_4$ specify the parameter defining the minimal refractive index, $c_1$ and $d_1$ specify the parameter defining the maximal doping level, $c_2$ and $d_2$ specify the parameter defining the spatial change of doping between the region with maximal doping level and undoped layers, $c_3$ and $d_3$ specify the parameter defining the location of the point of the inflection of the doping profile.

In a preferred embodiment of the invention the laser diode has a ridge-type structure, wherein the ridge is created up to the depth in a range from the light emitting layer to at least the first derivative of function (W2), preferably to the depth in range of 99% to 80% of the maximum value of the refractive index $n_p$, defined by equation (W2).

In the next preferred embodiment of the invention, between the lower light-guiding-cladding layer and the light emitting layer, there is a lower light-guiding layer, which can have an n-type electrical conductivity or be an undoped layer.

Preferably, between the light emitting layer and the upper light-guiding-cladding layer, there is an upper light guiding layer, which can have a p-type electrical conductivity or be an undoped layer.

In a preferred embodiment of the invention the upper light-guiding-cladding layer contains a region blocking the escape of electrons. Alternatively, the region blocking the escape of electrons can be present outside of the upper light-guiding-cladding layer, e.g. above it. The region blocking the escape of electrons can be acceptor doped in range of $10^{19}$ cm$^{-3}$ to $10^{20}$ cm$^{-3}$.

In another preferred embodiment of the invention the subcontact layer is doped with acceptors concentration above $10^{20}$ cm$^{-3}$.

In the next preferred embodiment of the invention the laser diode emits light having the wavelength in range of 380 nm to 555 nm.

In one of the embodiments of the invention the lower and/or upper light-guiding-cladding layer, as well as lower and/or upper light guiding layer, can be made of material GaN, InGaN or AlGaN, wherein the In content in InGaN alloy does not exceed 15%, the Al content in AlGaN alloy does not exceed 20%.

In the present invention the laser diode is grown using epitaxy process based on an AlInGaN alloy. Continuous, non-step-like and smooth change of the refractive coefficient of individual layers can be obtained by changing the flow rate of the proper carrier gas during layer growth, as well as by changing the temperature during the growth of a particular layer, or by simultaneous changing of both parameters during the growth of a particular layer. The electron blocking layers and the doping of these layers, according to the present invention, are treated as local variations of the refractive index and doping concentration, and are not taken into account in equation W2 and W4, respectively. By applying a continuous, non-step-like and smooth change of indium and/or aluminium content in lower and upper light-guiding-cladding layer, an analogical, continuous, non-step-like and smooth change of refractive index in these layers was obtained. That, in turn, allowed obtaining a higher coverage of the optical mode with the active region (the light emitting layer) and, due to its non-step-like character, avoiding an interface arising between the waveguide and cladding, resulting in an energy barrier in the bands, inhibiting the carrier movement to the active region. The parameters used in equations W1-W4 provide an optimal change of the refractive index in layers with epitaxial growth and an optimal mode coverage with the laser diode active region. Using, in construction of the laser diode according to the present invention, a lower light guiding layer, distributed between the lower light-guiding-cladding layer and the active layer, allowed providing proper reactor conditions for optimal well growth (temperature change), due to which high quality quantum wells were obtained. Whereas the upper light guiding layer, distributed between the active layer and the upper light-guiding-cladding layer, was protecting the quantum wells from thermal decomposition during growth (the upper light guiding layer is grown in a temperature similar to the active layer growth). Moreover, both the lower light guiding layer and the upper light guiding layer allow optimizing the location of the optical mode maximum in relation to the active layers, thereby increasing the light filling coefficient of the active region. Additionally, these layers prevent the diffusion of dopants (particularly magnesium) to the active region, preventing the forming of non-radiative recombination centres in the light emitting region. The invention allows obtaining a laser diode with a lower current threshold, arising from a higher coverage of the optical mode with the active region, improving carrier injection to the active region and avoiding the arising of interfaces between the light guide cladding and the light guide.

Figure 1:
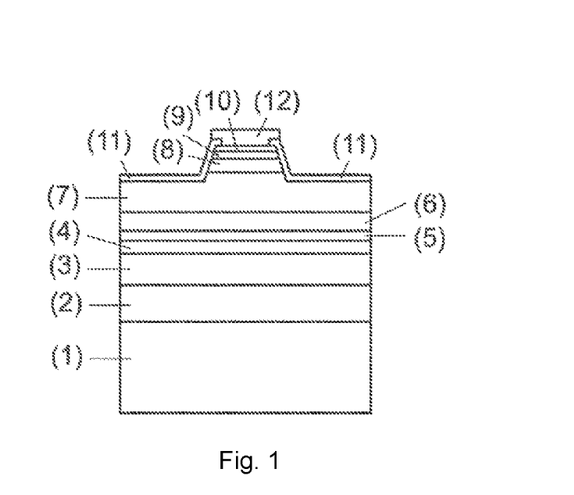
FIG. 1 shows a cross section of the laser diode according to one embodiment of the present invention.
Figure 2:
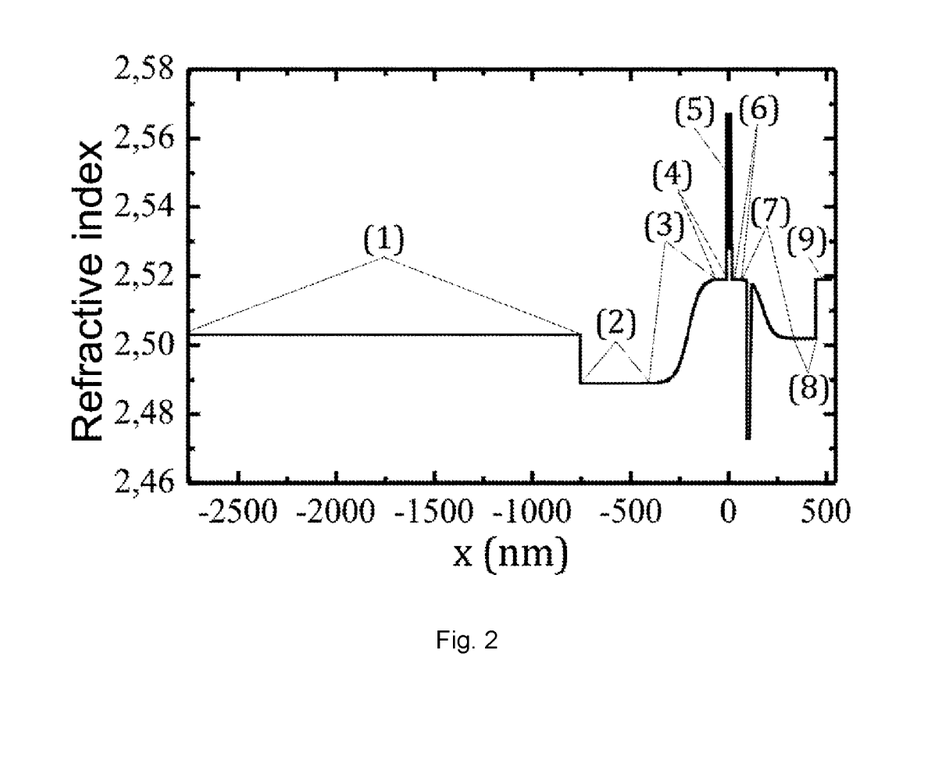
FIG. 2 shows refractive index profile of the laser diode layers, according to one embodiment of the present invention.
Figure 3A:
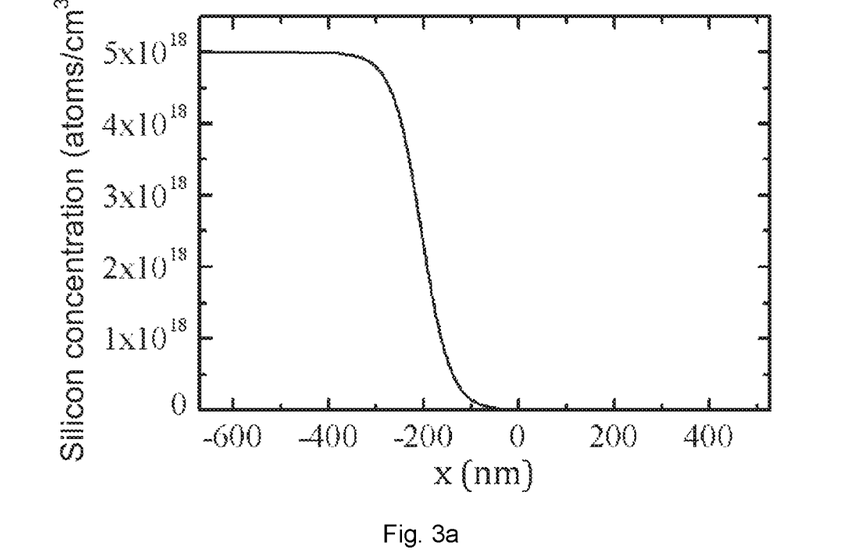
FIGS. 3a and 3b show the doping profile of the laser diode, according to one embodiment of the present invention, for silicon and magnesium, respectively.
Figure 3B:
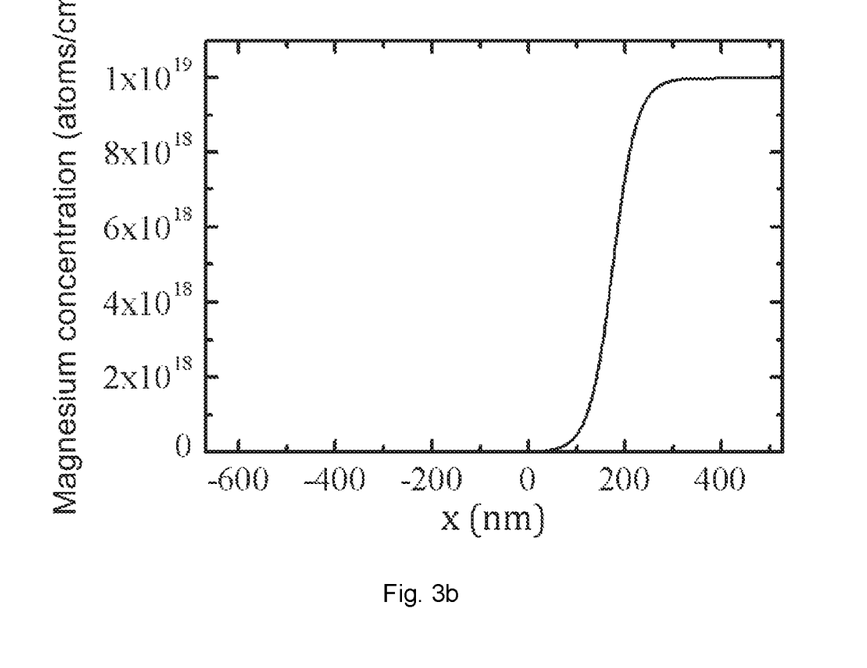
Figure 4A:
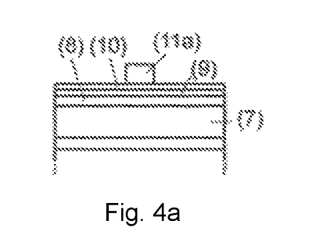
FIGS. 4a-4e show the consecutive technological steps of manufacturing of the laser diode ridge, according to one embodiment of the present invention.
Figure 4B:
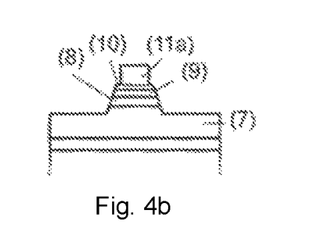
Figure 4C:
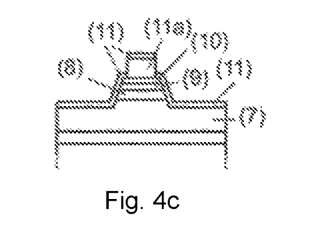
Figure 4D:
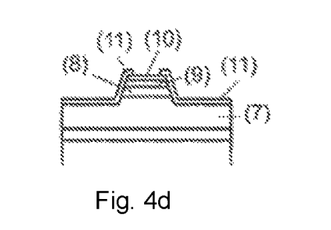
Figure 4E:
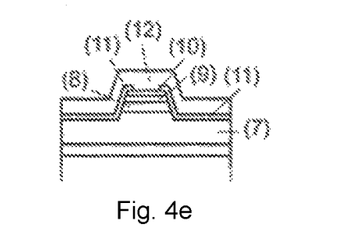
Figure 5A:
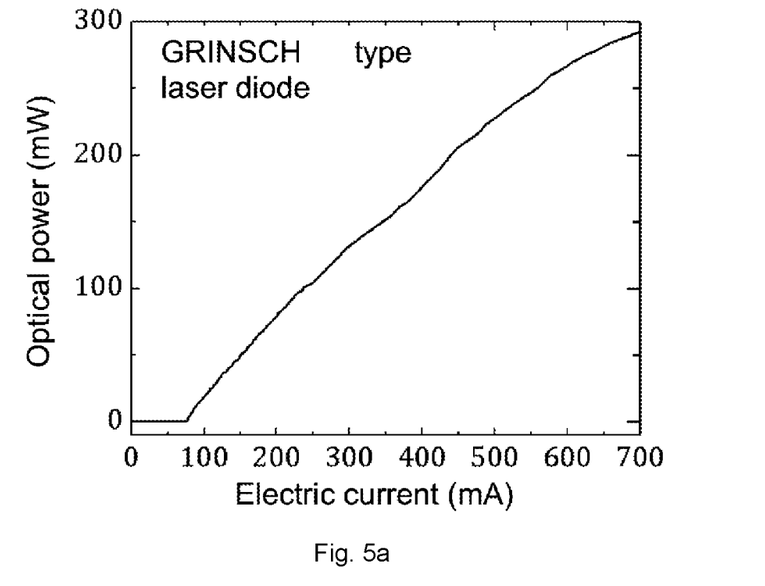
FIGS. 5a and 5b how the optical power dependence on current, for the laser diode according to one embodiment of the present invention and a reference laser diode, respectively.
Figure 5B:
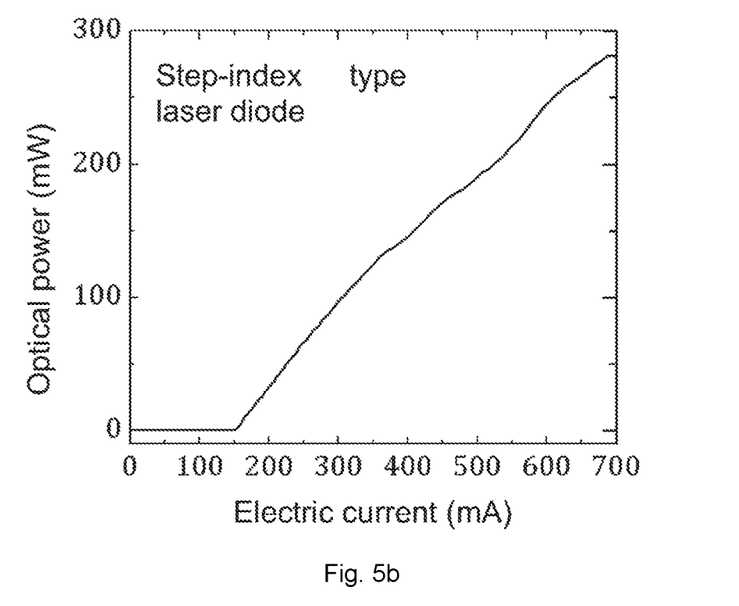

Exemplary embodiments of the invention are presented in a drawing, where FIG. 1 shows a cross section of the laser diode according to one embodiment of the present invention, FIG. 2 shows refractive index profile of the laser diode layers, according to one embodiment of the present invention, FIG. 3a and FIG. 3b show the doping profile of the laser diode, according to one embodiment of the present invention, for silicon and magnesium, respectively, FIG. 4 shows the consecutive technological steps of manufacturing of the laser diode ridge, according to one embodiment of the present invention, FIG. 5a and FIG. 5b show the optical power dependence on current, for the laser diode according to one embodiment of the present invention and a reference laser diode, respectively.

Example 1

One of the possible embodiments of the present invention is a laser diode, emitting electromagnetic waves with 425 nm wavelength, manufactured on a uniform $GaO_xN_{1-x}$ substrate, obtained in high pressure growth, with a structure shown in FIG. 1. In the first step a $GaO_{0.0005}N_{0.9995}$ substrate was made by means of growing from a gallium solution of nitrogen under the pressure of 1000 MPa and at temperature of 1500° C. The obtained crystal was cut and polished so as to obtain a parallel-flat plate with typical thickness of 200 μm. After appropriate mechano-chemical polishing, the crystal surface with gallium polarity had an atomic smoothness, demonstrated by the atomic steps in an Atomic Force Microscope image. The crystal surface was misoriented by 0.5° in relation to the direction of the crystallographic axis c of the GaN hexagonal (wurtzite) structure.

Next, the substrate 1 was placed in a MOVPE reactor, where a 300 nm thick $Ga_{0.92}Al_{0.08}N$ cladding layer 2 doped with silicon to the $5 \times 10^{18}$ cm$^{-3}$ level at the temperature of about 1050° C. was created. Afterwards, the growth was continued, changing the carrier gases flow and the growth temperature in a continuous way, creating a 350 nm thick light-guiding-cladding layer 3. This way a continuous content change (lowering the aluminium content) was obtained, corresponding to the refractive index $n_n$ profile, shown in FIG. 2 (region 3). The refractive index profile of the created light-guiding-cladding layer 3 is described by equation W1 with following set parameters: $a_1$=2.5195, $a_2$=30, $a_3$=−205, $a_4=2.489$. Simultaneously, a silicon dopant was introduced to the light-guiding-cladding layer 3 in order to ensure an n-type conductivity according to equation W3, where the parameters had following values: $c_1=5\times10^{18}$, $c_2=30$, $c_3=-205$. Doping profile $dop_n$ of the lower light-guiding-cladding layer 3 is presented in FIG. 3a. Next, an about 20 nm thick undoped GaN lower light guiding layer 4 was created, functioning also as a lower waveguide. After lowering the temperature to 820° C., a $In_{0.1}Ga_{0.9}N/In_{0.02}Ga_{0.98}N$ multi quantum well region was crated, having a thickness of 2.5 nm and 7.4 nm, accordingly, which constituted the light emitting layer 5, where the number of quantum wells was three. Next, the temperature was raised to 900° C. and a 45 nm thick undoped GaN upper light guiding layer 6 was created, being a part of the light guide region. The growth was continued, changing the flow of carrier gases and temperature in a continuous manner, in order to obtain the content changes corresponding to the refractive index $n_p$ profile shown in FIG. 2. (region 7). The changes included introducing aluminium to the layer and increasing its amount. The refractive index $n_p$ profile of the created upper light-guiding-cladding layer 7 is described by equation W2, for which the specific parameters have following values: $b_1=2.5192$, $b_2=25$, $b_3=175$, $b_4=2.502$, and its thickness is equal to 250 nm. Simultaneously, a magnesium dopant was introduced to the upper light-guiding-cladding layer 7, in order to unsure a p-type conductivity, according to equation W4, where the coefficients had following values: $d_1=1\times10^{19}$, $c_2=25$, $c_3=175$. Doping profile $dop_p$ of the upper light-guiding-cladding layer 7 is shown in FIG. 3b. During the growth of the upper light-guiding-cladding layer 7, in the distance of 48 nm from the last quantum well, the reactor temperature was raised abruptly to the level of 1050° C., in order to create layer blocking the escape of electrons made of $Al_{0.2}Ga_{0.8}N$:Mg alloy, where the doping was performed on the level of $5\times10^{19}$ cm$^{-3}$. The next layer was a 125 nm thick upper cladding layer 8 having a constant $Al_{0.05}Ga_{0.95}N$ composition, doped to the level of $1\times10^{19}$ cm$^{-3}$. The structure growth was finished by an 80 nm thick GaN:Mg thin subcontact layer 9 with magnesium concentration higher than $10^{20}$ cm$^{-3}$. After completion of the structure growth the reactor was cooled in nitrogen atmosphere.

The next technological step was depositing of the upper 10 and lower contact (on substrate 1) made of nickel-titan-gold or nickel-gold or nickel-molybdenum-gold or nickel-palladium-gold alloy, having 100-500 nm thickness. Afterwards, photolithography defining the ridge shape was performed, in a form of straight strip perpendicular to the crystal cleavage planes (the future light guide exit windows).

Process of creating the ridge and upper contact is shown schematically in FIG. 4. The first technological step was depositing a photoresist layer 11a, having a thickness of 0.5 μm to 5 μm, on the designed light guide area. Next, a two-step dry etching of the crystal, using active ions, was performed. In the first step, the gold not covered by photoresist is etched entirely. In the second step, a ridge is etched to the depth, for which the first derivative of equation W2 has a minimum. For the presented example, that value was equal to 173 nm from the active region, that is 360 nm from the structure surface.

For another example, etching of the ridge to the point, where refractive index value is in range of 99% to 80% of the maximum value of the refractive index $n_p$, defined by equation W2, is preferred. That means, for the presented example, this range is from 90 nm to 178 nm from the active region that is from 443 nm to 355 nm from the structure surface.

In this manner, a ridge was created in the upper contact 10, subcontact layer 9, upper cladding layer 8, and partly in the upper light-guiding-cladding layer 7, which is shown on a diagram in FIG. 4b. Afterwards, a 250 nm thick insulator layer 11 made of $SiO_2$, shown in FIG. 4c, was deposited on the whole crystal. Due to the high thickness of the photoresist, its side edges are not fully covered by the insulator 11. Wet etching allows uncovering of the ridge (FIG. 4d), while simultaneously leaving the insulator 11 on the ridge side walls and the area outside the ridge. The next technological step was electrolytic deposition of the upper contact 12, having a thickness of 1 μm to 8 μm.

Then, the crystal was separated along the crystal cleavage planes, forming strips containing many devices, wherein the separation took place along the designed locations of the light guide windows of individual devices. The first step enabling the separation was scratching the crystal along the intended division lines. Next, due to the mechanical stresses, the crystal was broken along the cleavage planes.

The next step was separating the strips on the individual devices performed in an analogical way to the division on the strips, except not along the cleavage planes, but perpendicularly to them.

The last step was the assembly of the devices in a standard TO-56 housing. A thin layer of SnPb solder, or a pad made of AlN, covered with an AuSn thin film or other solder was placed on the housing socket. The device was placed on said layer with the substrate side (FIG. 1, region 1), covered with the contact, towards the solder. Process of annealing in a temperature above the solder melting point allowed a permanent connection of the device and support. Afterwards, an electrical contact with the upper contact 12 (FIG. 1, region 12) material was made, using the ball-bonding technique. Then, the housing of the laser was hermetically closed, using protective atmosphere preventing water condensation inside the housing.

Due to applying the lower and upper light-guiding-cladding layer 3 and 7, with non-linear change of the refractive index and non-linear doping profile, the laser threshold current was decreased and the power as a function of current, above the threshold current of the laser diode, was increased which is shown in FIG. 5a, in relation to the reference laser diode with identical layer structure of the device, having a conventional step-like waveguide structure, for which the opto-electric dependence is shown in FIG. 5b. Thereby the presented technical problem was solved.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting, but are instead exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

The embodiment of the invention in which an exclusive property or privilege is claimed is defined as follows:

1. An AlInGaN alloy based laser diode, comprising:
a gallium nitride substrate;
a lower cladding layer with n-type electrical conductivity;
a lower light-guiding-cladding layer with n-type electrical conductivity;
a light emitting layer;
an upper light-guiding-cladding layer with p-type electrical conductivity;
an upper cladding layer with p-type electrical conductivity; and
a subcontact layer with p-type electrical conductivity;
wherein the lower light-guiding-cladding layer and upper light-guiding-cladding layer have a continuous, non-step like and smooth change of indium and/or aluminium content.

2. The laser diode according to claim 1, wherein the lower light-guiding-cladding layer has a continuous, non-step-like and smooth change of the refractive index nn, described by the equation (W1):

$$n_n = \frac{a_1 - a_4}{1 + e^{\frac{-(x-a_3)}{a_2}}} + a_4, \quad (W1)$$

where x is distance from the light emitting layer; $a_1$ is in range of 2.38 to 2.66; $a_2$ is in range of 1 to 100; $a_3$ is in range of −800 to 0; $a_4$ is in range of 2.32 to 2.57.

3. The laser diode according to claim 1, wherein the lower light-guiding-cladding layer has a continuous, non-step-like and smooth change of the silicon doping profile $dop_n$, described by the equation (W3):

$$dop_n = \frac{-c_1}{1 + e^{\frac{-(x-c_3)}{c_2}}} + c_1, \quad (W3)$$

where x is distance from the light emitting layer; $c_1$ is in range of $1 \times 10^{18}$ to $1 \times 10^{20}$; $c_2$ is in range of 1 to 100; $c_3$ is in range of −800 to 0.

4. The laser diode according to claim 1, wherein the upper light-guiding-cladding layer has a continuous, non-step-like and smooth change of the refractive index np, described by the equation (W2):

$$n_p = \frac{b_4 - b_1}{1 + e^{\frac{-(x-b_3)}{b_2}}} + b_1, \quad (W2)$$

where x is distance from the light emitting layer; $b_1$ is in range of 2.32 to 2.57; $b_2$ is in range of 1 to 100; $b_3$ is in range of 0 to 800; $b_4$ is in range of 2.38 to 2.66.

5. The laser diode according to claim 1, wherein the upper light-guiding-cladding layer has a continuous, non-step-like and smooth change of the silicon doping profile $dop_p$, described by the equation (W4):

$$dop_p = \frac{d_1}{1 + e^{\frac{-(x-d_3)}{d_2}}}, \quad (W4)$$

where x is distance from the light emitting layer; $d_1$ is in range of $1 \times 10^{18}$ to $1 \times 10^{20}$; $d_2$ is in range of 1 to 100; $d_3$ is in range of 0 to 800.

6. The laser diode according to claim 4, wherein the diode has a ridge structure, wherein the ridge is created to the depth in range from the light emitting layer to at least the first derivative of function (W2), preferably to the depth in range of 99% to 80% of the maximum value of the refractive index $n_p$, described by equation (W2).

7. The laser diode according to claim 1, wherein between the lower light-guiding-cladding layer and the light emitting layer there is a lower light guiding layer, which can have an n-type electrical conductivity or be an undoped layer.

8. The laser diode according to claim 1, wherein between the light emitting layer and the light-guiding-cladding layer there is an upper light guiding layer, which can have a p-type electrical conductivity or be an undoped layer.

9. The laser diode according to claim 1, wherein the upper light-guiding-cladding layer contains a region blocking the escape of electrons.

10. The laser diode according to claim 1, wherein the subcontact layer is doped with acceptors above the concentration level of $10^{20}$ cm$^{-3}$.

11. The laser diode according to claim 1, wherein it emits light with wavelength in range of 380 nm to 555 nm.

* * * * *